United States Patent [19]

Contiero et al.

[11] Patent Number: 4,774,198

[45] Date of Patent: Sep. 27, 1988

[54] SELF-ALIGNED PROCESS FOR FABRICATING SMALL DMOS CELLS

[75] Inventors: Claudio Contiero, Buccinasco; Antonio Andreini, Milan; Paola Galbiati, Monza, all of Italy

[73] Assignee: SGS Microelettronica SpA, Catania, Italy

[21] Appl. No.: 19,785

[22] Filed: Feb. 26, 1987

[30] Foreign Application Priority Data

Mar. 6, 1986 [IT] Italy ................. 83608 A/86

[51] Int. Cl.⁴ ............... H01L 21/425; H01L 29/78
[52] U.S. Cl. ............................ 437/30; 437/29; 437/56; 437/150; 437/158; 357/23.4
[58] Field of Search ................. 437/27, 29, 30, 56, 437/150, 157, 158; 357/23.4

[56] References Cited

U.S. PATENT DOCUMENTS

| | | | |
|---|---|---|---|
| 4,443,931 | 4/1984 | Baliga et al. | 357/23.4 |
| 4,466,176 | 8/1984 | Temple | 357/23.4 |
| 4,618,872 | 10/1986 | Baliga | 357/23.4 |
| 4,630,084 | 12/1986 | Tihanyi | 357/23.4 |
| 4,661,838 | 4/1987 | Wildi et al. | 357/23.8 |
| 4,717,940 | 1/1988 | Shinohe et al. | 357/38 |

OTHER PUBLICATIONS

"The Optimization of ON-Resistance in Vertical DMOS Power Devices with Linear and Hexagonal Surface Geometries", by Kenneth Board, et al., appeared on IEEE Transactions on Electron Devices, vol. ED. 31, No. 1, Jan. 1984.

"Les Limites de la resistance á L'état passant des DMOS de puissance" by Pierre Aloisi of Motorola of Toulouse-France.

Primary Examiner—Olik Chaudhuri
Attorney, Agent, or Firm—Wenderoth, Lind & Ponack

[57] ABSTRACT

An improved fabrication process for vertical DMOS cells contemplates the prior definition of the gate areas by placing a polycrystalline silicon gate electrode and utilizing the gate electrode itself as a mask for implanting and diffusing the body regions, while forming the short region is carried out using self-alignment techniques which permit an easy control of the lateral extention of the region itself. A noncritical mask defines the zone where the short circuiting contact between the source electrode and the source and body regions in the middle of the DMOS cell will be made, also allowing the forming the source region. Opening of the relative contact is also effected by a self alignment technique, further simplifying the process.

5 Claims, 2 Drawing Sheets

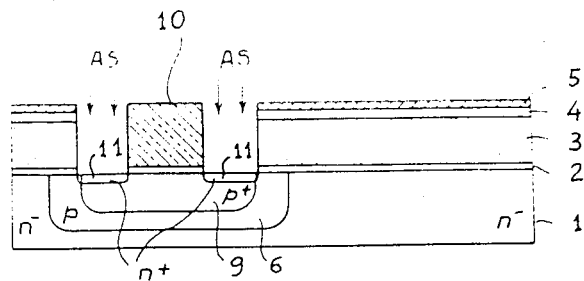
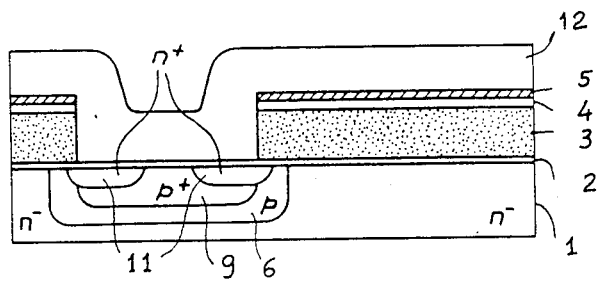
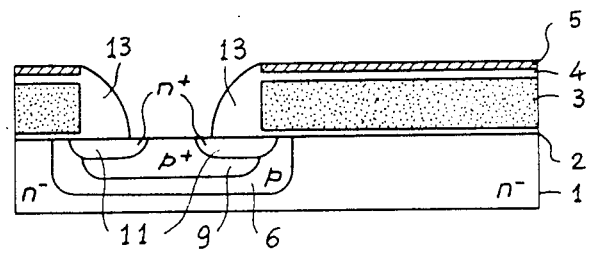
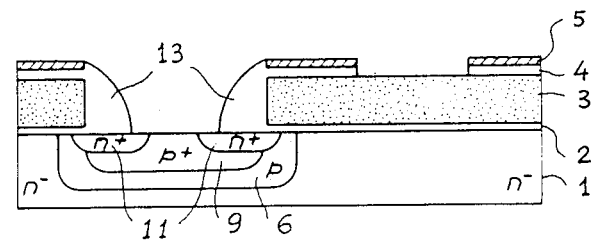
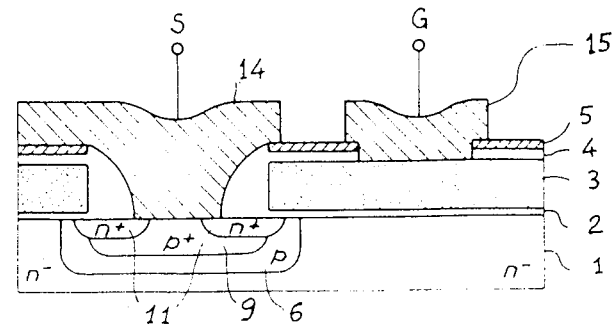

SELF-ALIGNED PROCESS FOR FABRICATING SMALL DMOS CELLS

BACKGROUND OF THE INVENTION

The present invention relates, in general, to the fabrication technology of MOS type semiconductor devices, and, more in particular, to that relative to power VDMOS devices or devices of modulated conductivity either in discrete form or in integrated form, where the symbol VDMOS identifies a MOS structure with horizontal diffused channel and vertical path of the current.

After a protracted evaluation of different structures, the VDMOS structure appears to have been adopted by the manufacturers of semiconductor devices as the structure which, at present, realizes the best compromise in the quest of an ideal power switching device.

In this respect, making the smallest possible the "ON-resistance" parameter, i.e. the ohmic resistance offered by the device under conduction conditions, represents a problem of prime importance in designing such power or conductivity modulation MOS devices.

The ON resistance of a VDMOS device is primarily determined by the value of two resistive contributions: the MOS channel resistance and the resistance of the epitaxial layer.

Many sudies of recent and less recent publication, among which: the article "The Optimization of ON-Resistance in Vertical DMOS Power Devices with Linear and Hexagonal Surface Geometries" by Kenneth Board, David J. Byrne and Malcom S. Towers appeared on IEEE Transactions on Electron Devices, Vol. ED. 31 No. 1, January 1984; and "Les limites de la resistance à l'éetat passant des DMOS de puissance" by Pierre Aloisi of Motorola of Toulouse - France, have evidenced that the main and determinant one of said contributions to the value of the ON resistance of said devices is tied essentially to the ratio between the extension of the outer boundary of the MOS channel and the area of the DMOS cell. Therefore, in order to decrease the ON resistance, it is necessary to make as large as possible said ratio by increasing the density of integration. In other words, being said power MOS devices formed by a large number of elementary cells connected in parallel, it is necessary to reduce as far as possible the dimensions of single cells and to increase their number.

In practice, the limitation to the reduction of the value of the ON resistance of VDMOS cells power devices, is determined by technological limits of area definition. Obviously, for fabricating such devices, the most sofisticated techniques are utilized, that is the VLSI processes (i.e. Very Large Scale Integration) while the shape of the individual VDMOS cells may be rectangular, square or hexagonal.

In the structure of a typical DMOS cell, e.g. n channel, whose channel is obtained by exploiting the difference of lateral diffusion of a "p" dopant and of a "n" dopant under the gate polycrystalline silicon, there exists a more heavily doped $p^+$ central region for short circuiting the p body with the $n^+$ source (such central region being known with the name of $p^+$ short).

This region should be as large as possible in the horizontal direction, though it should not encroach into the p region, that is alter the doping level of the p silicon region channel and consequently increase the value of the threshold voltage of the DMOS cell.

On the other hand, such a $p^+$ short region should extend as far as possible in a horizontal sense in order to lower the gain of the parasitic $n^+/p/n^-$ transistor which could, under certain circuit situations, interfere and jeopardize the characteristics of the power MOS device or of the equivalent conductivity modulation MOS device.

These stringent geometrical requisites of the $p^+$ short region reflect in the necessity to proceed to a stage of accurate alignment of the "window" or aperture, for the implantation and diffusion of the dopant to form said $p^+$ silicon region, in relation to the edge of the layer of the gate polycrystalline silicon. In practice, the fabrication process contemplates a first masking for implating boron followed by the formation of the layer of thermally produced gate oxide, by the deposition of polycrystalline silicon, by the definition of the gate polycrystalline silicon, thence followed by a second boron implantation to form silicon regions in the channel regions.

The multiplication of critical stages of accurate area definition hardly conciliate itself with the previously discussed requirement of increasing as far as possible the degree of integration with the aim of decreasing the ON resistance of the device.

SUMMARY OF THE INVENTION

It is, therefore, an objective of the present invention to provide an improved process of fabricating power MOS devices, according to which the formation of the short circuiting $p^+$ region for n channel devices (or $n^+$ for p channel devices) between a $n^+$ (or $p^+$) source region and a p (or n) body region takes place under self-alignment conditions with respect to the edge of the gate polycrystalline silicon, thus eliminating the problems connected to the definition of a specific alignment mask and simplifying the fabrication process.

It is a further objective of the present invention to form a power or a conductivity modulation MOS device made up of VDMOS cells having an improved structure.

These objectives and advantages are obtained, in accordance with the present invention, by providing a new process of fabrication contemplating the definition of the area, the implantation of the dopant through an aperture formed through the layer of gate polycrystalline silicon and the subsequent diffusion for forming the body region, followed by implantation and diffusion, under self-alignment conditions, of a region of relatively high doping level, entirely contained in said body region in order to form a short circuiting region between the source and body regions.

A second masking stage, using a substantially noncritical mask, allows to define, by means of a "plug" of photoresist material in the middle of the aperture formed through the layer of gate polycrystalline silicon, what will be the contour of the short circuiting zone between the source electrode, the source region and said short circuiting region, as well as the "window" through which the dopant is implanted and subsequently diffused to form the source region of the DMOS cell.

The subsequent opening of the source contact is also performed by a self-aligned technique further limiting the number of masks required by the process.

The structure of the VDMOS cell of the invention distinguishes itself by the fact that the short circuiting region, having a high doping level, advantageously results practically aligned with the edge of the layer of gate polycrystalline silicon thus reducing the residual base resistance of the parasitic transistor. Moreover, being the contact zone self-aligned with the gate electrode, it is possible to decrease the dimensions of the cells thus increasing the density of integration.

BRIEF DESCRIPTION OF THE DRAWINGS

These and other aspects of the invention will be more easily recognized and understood by the expert technician through the following detailed description of an embodiment of the invention preferred at present, also with reference to the annexed drawings, wherein FIGS. from 1 to 10 are schematic vertical sections showing the general architecture of a device manufactured in accordance with the process of the present invention after having undergone successive steps of the process in accordance with the present invention. That is.

DESCRIPTION OF THE PREFERRED EMBODIMENT

The figures and the detailed description which follows refer to the case of n channel MOS devices, naturally the same considerations are equally valid in the case of p channel MOS devices having the attention to invert n polarity with p polarity and viceversa.

The figures, moreover, limit themselves to show the section of the layer of epitaxially grown silicon (EPI) on a slice or "wafer" of monocrystalline silicon not shown in the figures.

The drain of the VDMOS cell shown in the figures may be formed on the rear of said wafer of substrate, which in such a case will be strongly doped, in the case of discrete devices. Otherwise the drain may be brought to the surface through a buried layer and a sinker diffusion in the case of integrated devices, in accordance with the usual techniques.

Figure 1:
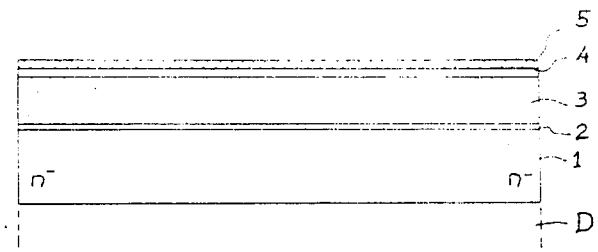

As shown in FIG. 1, initially the process comprises:
- the stage of epitaxially growing a layer 1 of n$^-$ monocrystalline silicon (n$^-$ EPI) of high resistivity, having a charge of atoms of a donor type impurity of about $5 \times 10^{15}$ atoms/cm$^3$ and a thickness of about 10 micrometers on a slice or wafer of monocrystalline silicon (not shown) constituting, or comprising, a drain region D of high conductivity;
- the stage of thermal gate oxidation of the surface of the silicon to form a layer of oxide 2 having thickness of about 700 Angstroms;
- the stage of depositing from low pressure vapor phase (LPCVD) a layer of polycrystalline silicon 3 having a thickness of about 5000 Angstroms;
- the stage of doping the polycrystalline silicon with phosphorus by implantation of by deposition from PCl3 until obtaining the desired conductivity of the layer of polycrystalline silicon;
- the stage of thermally oxidizing the surface of the polycrystalline silicon forming a layer of oxide 4 of thickness of about 2000 Angstroms; and
- the stage of depositing from vapor phase (CVD) a layer 5 of silicon nitride having a thickness of about 3000 Angstroms.

Successively the process of fabrication continues with a masking step for defining the gate areas (electrodes).

Figure 2:
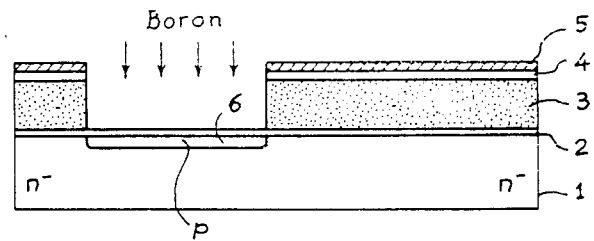
FIG. 2 is a cross-sectional view of the device shown in FIG. 1 after undergoing various processing steps and FIG. 3 is a cross-sectional view of the device shown in FIG. 2 after undergoing other various processing steps, etc.

The opening of the "window" destined to the formation of the DMOS cell, is preferably effected by RIE (Reactive Ion Etch) attack in a plasma of CF4+H2 or of CHF3+CO2, under highly anisotropic conditions, without softening the profile of the photoresist mask, in order to produce an opening through the layers of nitride (5), oxide (4 and 2) and of polycrystalline silicon (3) with edges substantially perpendicular to the surface fo the silicon, that is generating a substantially vertical step or anyway comprised preferably between 80° and 90°, as shown in FIG. 2.

Boron atoms may then be implanted for forming a p region 6 obtained by a deep diffusion process, which will constitute the channel region with a maximum boron content of about $5 \times 10^{16}$ atoms/cm$^3$.

Figure 3:
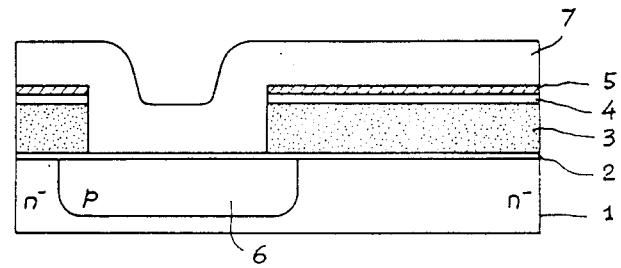

After having performed the diffusion, a layer 7 of silicon oxide having a thickness of about 1 micrometer is deposited from vapor phase in a low pressure system under conditions of high conformability and, preferably, the profile of such a layer 7 is softened (planarized) by the known technique of thermally "re-flowing" the oxide at a temperature of about 1050° C., as shown in FIG. 3.

Figure 4:
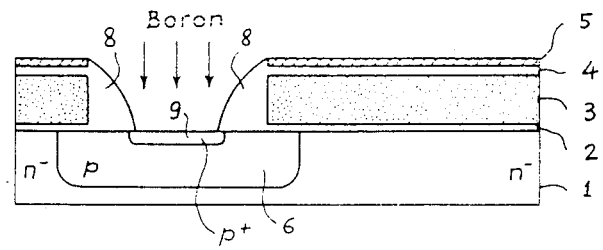

By a RIE attack, in a CF4+H2 or CHF3+CO2 plasma, of the CVD deposited SiO2 layer, a substantially triangular shaped residue 8 of silicon oxide is left on the lateral walls or edges of the polycrystalline silicon layer 3 with the function of a "spacer", which will act as mask for the subsequent boron implantation for forming a p+ region 9, entirely contained in the p region 6, formed previously, as shown in FIG. 4.

By these steps, a perfect alignment of the short circuiting p+ diffused region 9 with the edge of the polycrystalline silicon layer 3 (gate electrode) is determined without recurring to an alignment masking step which, necessarily, would be extremely critical for the performances of the device and which would inevitably limit the possibility of reducing the dimensions of the elementary DMOS cell.

Figure 5:
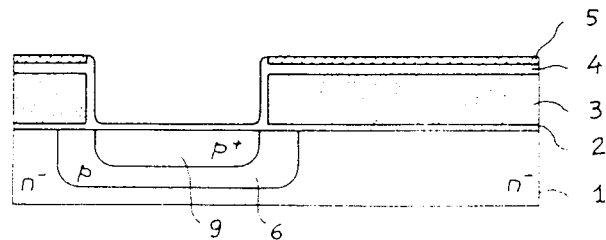

Diffusion of the implanted boron follows to form said p+ region 9. The spacers 8 of silicon oxide, along the edge of the polycrystalline silicon layer 3, are removed and the surface of the monocrystalline silicon is thermally oxidized (2) together with the exposed edge of the polycrystalline silicon, for a thickness of about 1000 Angstroms, as shown in FIG. 5.

At this point, by a noncritical masking step, a zone is defined in correspondence of which will be formed the short circuiting contact among the source electrode, the source region and said p+ short region, in a substantially central position of the DMOS cell, that is of the window through the layer of gate polycrystalline silicon.

After having removed, by plasma attack, the layer of thermal silicon oxide 3 in the unmasked area until exposing the monocrystal, arsenic is implanted to form the n+ source region 11; the central "plug" of masking photoresist 10 and the polycrystalline silicon layer 3 constituting the mask for said operation, as shown in FIG. 6.

After, the masking photoresist plug 10 is removed and the implanted arsenic is diffused forming the n+ source region 11 and the surface of the crystal is thermally re-oxidized for about 1000 Angstroms. After, in a low pressure system, a new layer of silicon oxide 12 having a thickness of about 1 micrometer is deposited conformally and, preferably, the profile is planarized as already described before thus obtaining a section such as the one shown in FIG. 7.

By the same procedure previously described, the deposited layer of silicon oxide 12 is anisotropically attacked by a RIE system, thus creating the desired spacers 13 along the edge of the polycrystalline silicon layer (gate electrode) which will act as the mask for the subsequent deposition of the metal 14 of the source contact, as shown in FIG. 8.

Thus, also the formation of the source contact is performed with self-alignment techniques, further simplifying the fabrication process of the device.

By a further masking step, the area destined to the gate contact is defined and the layers of silicon nitride 5 and of the underlying silicon oxide 4 are attacked through the appropriate window in the photoresist mask, until exposing the polycrystalline silicon layer 3, as shown in FIG. 9.

The fabrication process proceeds through the customary step of depositing from vapor phase or by sputtering, the metallization layer, preferably using aluminum with a small amount of silicon; of further masking for defining the paths in the metallization layer, and of attacking the latter, followed then by a heat treatment for improving the electric contact at the interface between the metal and the silicon. The section will appear as shown in FIG. 10. The process contemplates further the deposition of passivation and insulation layers and the definition and opening of the pads for the electrical connection of the leads.

The process of the invention offers remarkable advantages as compared to the known processes. In the first place, by the self-alignment techniques utilized, critical masking steps are substantially eliminated thus making easier to increase the density of integration, for obtaining a low ON resistance of the devices.

Moreover, the forming of the heavily doped short region between the source and body regions takes place under conditions of accurate dimensional control, thus allowing a more precise geometry which permits to enlarge the lateral dimensions of the short region for more efficiently suppressing the parasitic transistor by reducing its residual base resistance, though effectively preventing said short region from extending itself beyond the limit set by the projection of the edge of the polycrystalline silicon of the gate electrode of the DMOS cell and therefore from encroaching into the channel zone.

As schematically shown in FIG. 10, the vertical type DMOS device (VDMOS) of the present invention is characterized by comprising a semiconductor slice of wafer operating entirely or partially as a drain region; a plurality of source regions, heavily doped with an impurity of a first type of conductivity, formed in the top portion of an epitaxially grown layer, lightly doped with an impurity of said first type of conductivity, grown on said wafer, each being formed inside distinct body regions, formed by moderately doping with an impurity of a second type of conductivity and diffusion; a gate electrode of polycrystalline silicon, formed on the surface of said epitaxially grown layer previously covered with an insulating layer of gate oxide, between adjacent body regions and superimposed to edges of the latter; a short region, heavily doped with an impurity of said second type of conductivity, entirely contained inside each of said body regions and whose perimeter coincides substantially with the perimeter of said gate electrode; a source electrode electrically in contact with both said source and short regions.

The substrate slice of wafer may itself constitute the drain region of the device in case of discrete type devices, in which case it will be preferably of heavily doped silicon and the drain electrode will be suitably formed on the rear of said wafer. In case of discrete power devices, the wafer is preferably of $n^+$ silicon, the epitaxially grown layer is of $n^-$ silicon and the elemntary DMOS cells are n channel. In case of conductivity modulation DMOS devices, a $p^+$ silicon wafer is preferably utilized instead.

The DMOS structure of the present invention may also be utilized for forming integrated VDMOS transistors. In this case, the drain region may be formed by a buried layer, the electrical contact with which may be brought to the surface by means of a sinker diffusion, according to known techniques.

What we claim is:

1. A process for fabricating vertical DMOS devices or integrated VDMOS transistors, comprising the steps of:
   (a) thermally oxidizing the surface of an epitaxially grown silicon layer lightly doped with an impurity of a first type of conductivity, grown on the surface of a slice of monocrystalline semiconductor material;
   (b) depositing a layer of polycrystalline silicon;
   (c) doping said polycrystalline layer;
   (d) thermally oxidizing the surface of said polycrystalline layer;
   (e) depositing a layer of silicon nitride on the oxidized surface of the polycrystalline layer;
   (f) selectively removing said layers of nitride, oxide and polycrystalline silicon, by anisotropic etching of areas where elementary DMOS cells will be formed;
   (g) implanting atoms of an impurity of a second type of conductivity in said etched areas and diffusing to form body regions whose extremes extend beyond the geometrical projection of edges of said etched polycrystalline silicon layer constituting a gate electrode;
   (h) depositing a layer of silicon oxide from a vapor phase on the whole exposed surface with a thickness greater than or equal to the sum of the respective thicknesses of said thermally grown oxide, said polycrystalline silicon layer, said thermally oxidized surface thereof and said silicon nitride layer present, as superimposed layers, over portions of the surface of said epitaxially grown layer;
   (i) thermally re-flowing the deposited layer of silicon oxide;
   (j) anisotropically etching said layer of deposited silicon oxide forming spacers along the edges of said superimposed layers;
   (k) implanting an impurity of said second type of conductivity, said spacers defining the implant window, removing said spacers, and forming, by diffusion, a heavily doped short region entirely contained inside said body region and whose lateral rim substantially coincides with the geometrical projection of the edges of said polycrystalline silicon layer, and forming an oxide film on the silicon layer;
   (l) defining, by masking with a photoresist, a central area of contact of short circuit at a middle position of said body region between opposing edges of said etched polycrystalline silicon layer;

(m) removing said oxide film not covered by said photoresist and implanting an impurity of said first type of conductivity utilizing said photoresist and said layer of polycrystalline silicon as mask, followed by removing the photoresist and diffusing to form heavily doped source regions; and (n) repeating steps (h), (i), and (j), for defining the electrical contact opening between a source electrode and said source and short regions.

2. A process as recited in claim 1, wherein said monocrystalline semiconductor slice is heavily doped silicon and constitutes the drain region of a discrete power device whose drain electrode is formed on the rear of said wafer.

3. A process as recited in claim 2, wherein said wafer of monocrystalline semiconductor is $n^+$ silicon, and said epitaxially grown layer is $n^-$ silicon and the elementary DMOS cells are n channel.

4. A process as recited in claim 2, wherein said monocrystalline semiconductor wafer is $p^{30}$ silicon, and said epitaxially grown layer is $n^-$ silicon and the elementary DMOS cells are n channel.

5. A process as recited in claim 1, wherein a buried layer is formed in said monocrystalline semiconductor wafer, said buried layer constituting the drain region of an integrated VDMOS transistor, and wherein the electrical contact to said buried layer is brought to the surface by a sinker diffusion process.

* * * * *